(12) United States Patent
Kapetanic et al.

(10) Patent No.: US 6,529,844 B1
(45) Date of Patent: Mar. 4, 2003

(54) VECTOR NETWORK MEASUREMENT SYSTEM

(75) Inventors: Peter Kapetanic, Morgan Hill, CA (US); Jon Martens, San Jose, CA (US); David Rangel, San Jose, CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 09/389,768

(22) Filed: Sep. 2, 1999

Related U.S. Application Data
(60) Provisional application No. 60/098,862, filed on Sep. 2, 1998, provisional application No. 60/098,865, filed on Sep. 2, 1998, provisional application No. 60/098,864, filed on Sep. 2, 1998, and provisional application No. 60/098,806, filed on Sep. 2, 1998.

(51) Int. Cl.[7] .............................................. G01R 35/00
(52) U.S. Cl. ........................ 702/85; 324/601; 324/613; 702/76; 455/67.3
(58) Field of Search .............................. 324/76.53, 601, 324/613, 638, 650; 702/85, 76, FOR 107, FOR 108, FOR 109, FOR 110, FOR 156, FOR 159

(56) References Cited

U.S. PATENT DOCUMENTS

| | | | | |
|---|---|---|---|---|
| 5,191,294 A | * | 3/1993 | Grace et al. ................. | 324/613 |
| 5,524,281 A | * | 6/1996 | Bradley et al. ............ | 455/67.3 |
| 5,548,538 A | * | 8/1996 | Grace et al. .................. | 702/85 |
| 5,587,934 A | * | 12/1996 | Oldfield et al. ................ | 702/85 |
| 5,715,183 A | * | 2/1998 | Grace et al. ................... | 702/85 |
| 5,825,669 A | * | 10/1998 | Oldfield et al. ............... | 702/85 |

* cited by examiner

Primary Examiner—John S. Hilten
Assistant Examiner—John Le
(74) Attorney, Agent, or Firm—Fliesler, Dubb, Meyer, & Lovejoy LLP

(57) ABSTRACT

A vector network analyzer (VNA) is provided with three test ports and an integration of hardware and software to make an integrated set of measurements for two and three port devices. The integrated capability allows for fast, versatile measurements that benefits, in accuracy and convenience, from sharing of data and resources with other measurements. The VNA includes a first signal source which is selectively connectable through reflectometers to two of the three VNA test ports. A second signal source provides connection through a third reflectometer to a third test port to enable full vector error corrected 3-port S-parameters measurements to be made. The two signal sources, along with software configuration of the VNA to operate in a non-ratioed mode provides for measuring second and third order intercept measurements. The two signal sources and software also enable the VNA to be used to make frequency translation measurements of a mixer including accurate frequency translation group delay measurements. The VNA further includes components to enable DUT noise figure to be determined, and to provide automatic calibration. The VNA further provides a process for harmonic measurement accuracy enhancement, and includes a dual mode multiple source/LO module to provide common mode noise rejection and fast measurement speed.

13 Claims, 9 Drawing Sheets

VECTOR NETWORK MEASUREMENT SYSTEM

CROSS-REFERENCE TO PROVISIONAL APPLICATION

This Patent Application claims the benefit of Provisional Application No. 60/098,862 filed Sep. 2, 1998, Provisional Application No. 60/098,865 filed Sep. 2, 1998, Provisional Application No. 60/098,864 filed Sep. 2, 1998, and Provisional Application No. 60/098,806 filed Sep. 2, 1998.

BACKGROUND OF THE INVENTION

1. Field of the Invention

The present invention relates to a vector network analyzer (VNA). More particularly, the present invention relates to measurement of s-parameters, third order intercept, harmonics, group delay, and noise figure using the VNA. The present invention further relates to measurement of three port devices, such as a mixer using the VNA, and calibration of the VNA.

2. Description of the Related Art

FIG. 1 shows a block diagram of components included in a conventional vector network analyzer (VNA). The VNA is configured to make vector measurements, including both magnitude and phase, of a device under test (DUT) connected across its two test ports A and B. The VNA includes a signal source which generates RF/microwave signals and can sweep over a range of frequencies. A switch selectively connects the signal source to one of two reflectometers A or B. The reflectometers A and B include couplers which couple a reference RF signal as provided from the signal source to one of test ports A and B, and a test RF signal received at one of the test ports A and B. The couplers are connected to downconverters in the reflectometers which downconvert the test and reference RF signals to intermediate frequency (IF) signals. Further components in the reflectometers then process the IF signals to provide full two port error corrected scattering parameters (S-Parameters), and other measurements such as group delay.

A conventional VNA may also include components to measure noise figure as illustrated in FIG. 2. The noise figure is a way of specifying the noise parameters of a component, and is defined as the ratio of the signal-to-noise ratio available from the device output to the signal-to-noise ratio delivered to the input of the device, at a standard reference temperature of 290K. Noise figure measurements are made using a noise source and receiver. The noise source typically includes a noise diode connected to a power supply. The noise source provides noise over a wide bandwidth to one port of a DUT, while the other port is connected to a receiver. The receiver downconverts the noise source signal from the DUT to an intermediate frequency (IF) range, and the IF signal is processed to provide an indication of power level enabling the noise figure to be determined over the frequency range.

In FIG. 2, the noise source in the VNA is connectable by a switch A through a reflectometer A to the measurement port A of the VNA. The switch A normally connects the signal source of the VNA through the reflectometer A to the test port A for standard VNA measurements and is switched to the noise source when noise figure measurements are desired. Similarly, a receiver is connectable by a switch B to the test port B of the VNA. The switch B then normally connects to the signal source for standard VNA measurements and is switched to the receiver when noise figure measurements are desired.

The receiver in FIG. 2 is separated from the reflectometers A and B, but its components are the downconverters and IF processor typically included in the reflectometers. Rather than use two separate receivers, switching is included in the receiver so that signals can be downconverted and processed from the reflectometers as well as the noise source stimulated DUT when the switches A and B are so configured.

Noise figure measurements have been performed for years with a wide variety of instruments, but the instruments have lacked flexibility. Usually the noise source and receiver must be attached directly to the DUT for all measurements, or the noise source is provided internally in a VNA, as shown in FIG. 2, for all measurements. The user, thus, has little choice with respect to test setup, noise source selection, or noise source traceability. With the receiver measuring power, and not operating in ratioed mode, the user cannot usually apply vector corrections using the VNA to compensate for DUT or system mismatches when the noise figure measurements are made.

Devices for measuring noise figure also do not allow a selection of frequency bandwidths for measurements which may limit the types of DUTs that can be measured using one test device. The measurement bandwidth being fixed for a given test system may also lead to either inordinately long test times or to inaccurate results.

A VNA may be used with an external automatic calibration as illustrated in FIG. 3. The external calibration device can include calibration components include elements such as a short, open, match and a thru connection which are selectively connectable by switches to test terminals which can be connected to test ports A and B of the VNA. The automatic calibration device can also include verification lines which are connectable by switches between its terminals to verify calibration once calibration is complete. The internal components are initially characterized using actual short, open, match and thru lines which are directly connected to the ports of the VNA. During calibration using the external calibration components, calculations are performed to account for imperfections in the calibration standards of the automatic calibration device based on measurements which are made and stored when measuring the actual calibration standards.

The automatic calibration device can be provided with a separate controller, as further shown in FIG. 3 which connects to the VNA and automatic calibration device to automatically control the calibration process. The VNA typically has a keypad which a user uses in conjunction with the external controller to type in commands to set up and run each calibration step after connecting a different standard. The controller is programmed to function as the user, and sends information to the VNA's processor to set up and run each calibration step after each calibration component is connected by internal switches in the automatic calibration device to the terminals of the VNA. The automatic calibration process is started by a user depressing a start button on the controller keypad. An automatic calibration device with components as described above, including a controller is described in U.S. Pat. No. 5,587,934 entitled "Automatic VNA Calibration Apparatus", to Oldfield, et al. which is incorporated herein by reference.

Since a conventional VNA includes only two ports and a single signal source, measurement of components requiring two input signals, such as a mixer, and measurements of parameters where two input signals are applied, such as second and third order intercepts, cannot be performed with a conventional VNA alone.

A typical set up for measuring the frequency translation parameters of a mixer is shown in FIG. 4. A first of two input signals $f_1$ is provided to the mixer from a VNA. Since the VNA only has one signal source, apart from its local oscillator, a second signal $f_2$ is provided from an external signal generator. The output of the mixer is then measured using a spectrum analyzer. The output of the mixer provides a frequency translation including a sum and difference of its input signals $f_1 \pm f_2$ along with higher harmonics of those signals at its output. The spectrum analyzer is used to measure the mixer output since the reflectometers of a VNA are typically configured to measure scattering parameters rather than to provide the function of a spectrum analyzer. Using the VNA to provide the input to one port of the mixer will allow use of the VNA to characterize one port of the mixer without reconfiguration of the mixer test setup.

A typical test set up for measurement of second or third order intercept is shown in FIG. 5. Second and third order intercept measurements are a way of characterizing distortion. Because of the increasing need for wide dynamic range at high frequencies, most wideband amplifiers, as well as other microwave and millimeter wave components, now have distortion specification. When two tones, or signals, are applied to an amplifier that is non-linear, the nonlinearity causes them to modulate one another, producing intermodulation distortion (IMD). The higher the second and third order intercept power levels, the higher the input level at which IMD becomes significant, and the lower the IMD will be at a given signal level. Second and third order intercept points are, thus, now typically specified for amplifiers.

FIG. 6 shows a plot illustrating how second and third order intercept points are derived. For measurements, two spectrally pure signals are applied to the amplifier. The output signal power in a single signal (in dBm) and the relative amplitudes of the second-order and third-order products referenced to the single signal and then plotted as shown in FIG. 6. Extrapolation of the measurements are also plotted as shown in dashed lines as a function of input signal power. Beyond a certain level, the output fundamental signal begins to limit, or compress. If the second and third order IMD lines are extended, they will intersect the extrapolated extension of the fundamental output line. The projected intersections are called the second and third-order intercept points.

As shown in FIG. 5, the setup for measurement of second or third order intercept, thus, includes two signal sources for providing two tone signals to a DUT and a spectrum analyzer for measuring the responsive outputs from the DUT. One of the two signal sources in FIG. 4 can be the VNA, as shown, enabling the VNA to be used for one port characterization without disturbing the test setup. Since the VNA only has one signal source, the second signal source is provided by a separate signal generator. The signals from the two signal sources are combined and provided to the single input of the DUT using a combiner. The combiner can be a coupler, power divider, or one of a variety of other types of devices. The output of the DUT is then connected to the input of the spectrum analyzer for measurement of the DUT output power. A combination of the DUT output power and the measured power level from one of the signal sources can be used to determine second and third order intercepts.

VNAs are typically configured to measure group delay using the formula $d\phi/d\omega$, where $\phi$ is the phase of an S21 transmission measurement. However, the measurement technique fails for frequency translating devices, such as mixers, since accurate and stable phase information is not available in these generally unratioed measurements, and VNAs are programmed make measurements in a ratioed manner. Presently, additional components such as reference path mixers must be used with a VNA to make frequency translated group delay measurements.

To reduce the amount of test equipment needed for any given microwave or millimeter wave test measurement, it would be desirable to provide a VNA that can measure second and third order intercept, group delay for frequency translating devices, or that can provide full error corrected characterization of any three port device with limited additional test components. With two signals being provided to a DUT, it is further desirable that common mode noise generated by the two signals not affect measurement accuracy, and that the signal sources have a fast relative settling time to provide a fast measurement speed.

With the dynamic range of DUTs which are typically tested increasing, it is further desirable to provide a VNA which can provide more accurate measurements over the dynamic range. In particular, with higher harmonic output measurements required from DUTs, it is desirable that measurements of harmonics of the DUTs be free of source harmonics.

SUMMARY OF THE INVENTION

In accordance with the present invention, a VNA is provided with a complete integration of various measurement capabilities into one optimized system, including full vector error corrected 3-port S-parameters measurements, second and third and higher order intercept measurement capability, frequency translation mixer measurement capability including frequency translating group delay measurement capability. The VNA further includes components to enable noise figure to be determined and to enable automatic calibration. The VNA further includes an enhanced measurement procedure to enable the harmonic response of a DUT to be measured over a wide range without limitations from the stimulus source harmonic level. The VNA further includes connections for a multiple source/LO module which provides multiple signals with limited common mode noise, and provides fast relative settling times for the sources, enabling faster system measurement speed.

The VNA includes three test ports with a first signal source connectable to two of the test ports through reflectometers, and a second signal connectable to the third test port through a reflectometer to enable full error corrected 3-port S-parameters measurements to be performed on a three port device.

The VNA includes software to enable it to function as a spectrum analyzer in a non-ratioed mode so that with use of the VNA with a coupler and the two signal sources, second and third order intercept measurements can be made. The two signals sources may also be connected through test ports of the VNA to two inputs of a mixer, and act in a non-ratioed mode to enable mixer frequency translation measurements to be made without requiring external test components.

With a signal source, an internal modulation synthesizer special IF circuits and appropriate software, frequency translation group delay measurements can be made using the VNA. To measure group delay, the the main carrier of the first signal source is modulated using the modulation synthesizer, and the phase change of the modulated signal is observed. Since the modulating frequency in most DUTs does not change, the measurement can be ratioed against the original modulating signal to extract phase data.

The VNA further includes components/software to enable it to provide the function as the controller for the automatic calibration device as shown in FIG. 3. The VNA keypad is then used entirely to control the automatic calibration process once the automatic calibration device is attached, and control signals are provided from a control connection between the VNA and automatic calibration device to control its switches.

The VNA further includes an additional external connection port for a noise source to allow user selection of different noise sources connected directly to a DUT, or alternatively connected through a VNA to make noise figure measurements more flexible. The VNA also includes a receiver with a downconverter IF output selectively provided through one of two channels, a wideband channel and a narrowband path. The wide IF path will provide the fastest measurements, but may be inappropriate for some narrowband DUTs. The narrowband path is available for measuring the noise figure of very narrowband devices such as devices operating over less than a 1 MHZ bandwidth.

The VNA further includes software for determining the harmonic response of a DUT which eliminates the effects of stimulus source harmonics. For the software, the vector sum of the DUT responses GHx to the source tuned to the fundamental with its associated harmonics is first measured. The harmonics from the DUT GNx with the source tuned to the fundamental are then obtained. Vector subtraction is then used to determine the output harmonic of the DUT, Hx, as follows Hx=GHx−GNx. The output harmonic Hx will be free from source harmonics.

The VNA can use a dual mode multiple source/local oscillator module to provide its two sources and local oscillator. The module includes both coarse and fine signal sources. The coarse signal sources can be connected together in a common offset mode, or can operate separately in an independent offset mode. Operation in the common offset mode provides greater dynamic tracking with a reduction of receiver If phase noise and improved IF settling time.

BRIEF DESCRIPTION OF THE DRAWINGS

Further details of the present invention are explained with the help of the attached drawings in which.

DETAILED DESCRIPTION

I. VNA Circuitry

Figure 7:
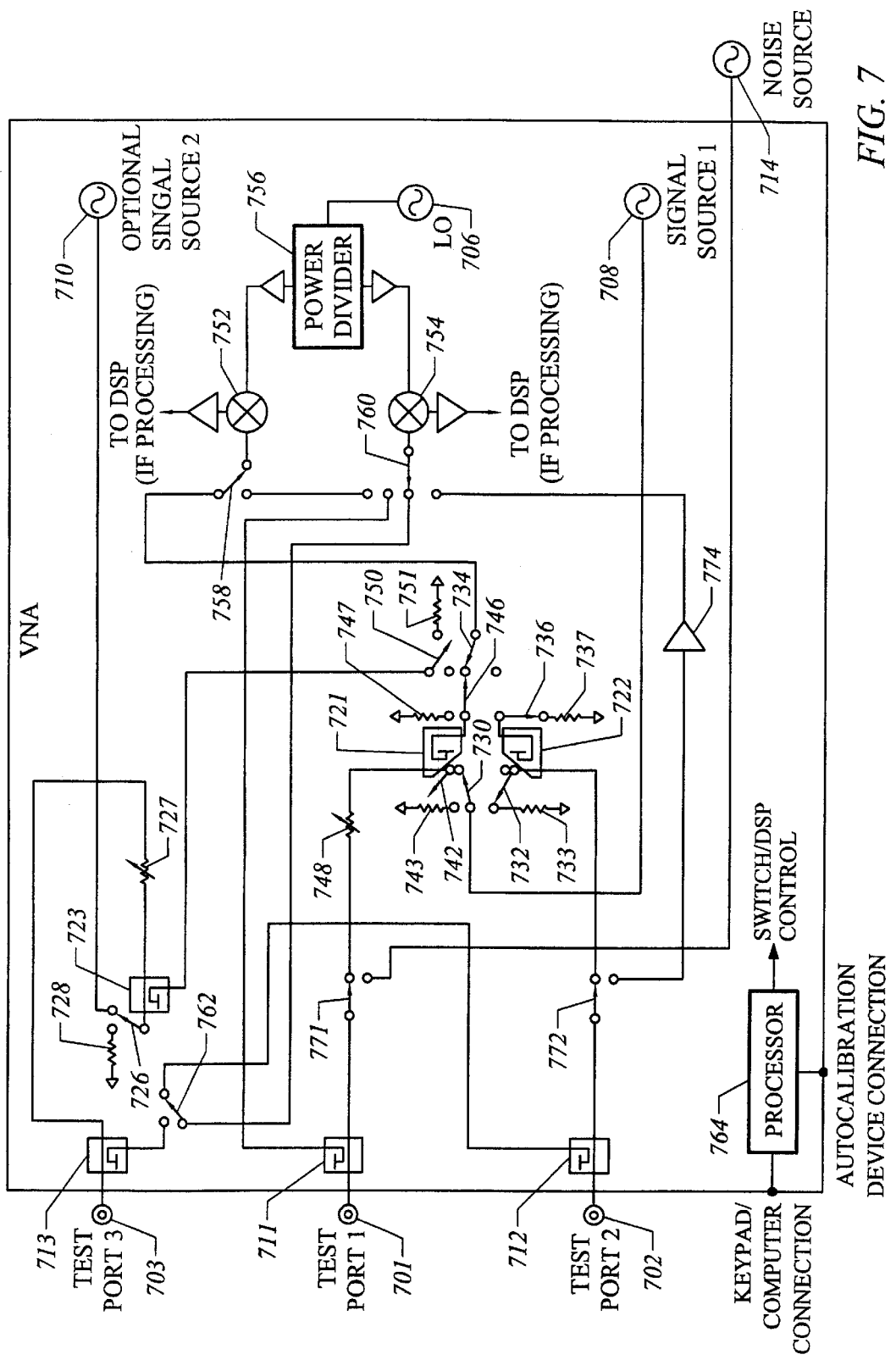
FIG. 7 shows components of a VNA in accordance with the present invention.

FIG. 7 shows circuit components of a VNA in accordance with the present invention. As shown, the measurement system includes three test ports 701–703. The VNA also has a backpanel with a connection port for removable connection of a noise source 714. A LO signal source 706 and RF sources 708 and 710 are shown provided internal to the VNA, but may alternatively be externally connected to the backpanel.

Reflectometer couplers 711–713 are provided for coupling a signal which is received at a respective one of the test ports 701–703. Reflectometers 721–723 are further provided for coupling a signal which is provided to a respective one of the test ports 701–703. The second signal source 710 is connectable by a switch 726 through the couplers 723 and 713 and a step attenuator 727 to the test port 703. The switch 726 can alternatively disconnect the second signal source 710 and connect the test port 703 to a termination.

The first signal source 708 is optionally connected by a switch 730 to one of the test ports 701 or 702. With the stimulus source 708 connected by switch 730 to test port 701, a switch 732 will connect the test port 702 to a termination, and the incident signal coupler 721 which is connected to the test port 701 will be connected by a switch 734 for connecting to downconverters, while a switch 736 will connect the incident signal coupler 722 to a termination 737. The signal source 708 will then be connected through couplers 711 and 721 and a step attenuator 748 to the test port 701.

With the source 708 connected by switch 730 to test port 702, a switch 742 will connect the test port 701 to a termination, and the incident signal coupler 722 which is connected to the test port 702 will be connected by a switch 734 for connecting to downconverters, while a switch 746 will connect the coupler 721 to a termination 737.

With the stimulus from the signal source 708 being the desired incident signal measurement for ratioing, the switch 750 will connect the coupler 723 to the termination 751, and the switch 734 will connect to one of the couplers 721 through one of the switches 746 or 736. With the signal source 710 being the desired incident signal for ratioing, the switch 750 will connect to switch 734 for connection to a downconverter, and switches 736 and 746 will both connect the couplers 721 and 722 to terminations 737 and 747.

Two downconverters 752 and 754 are provided for mixing an RF signal and a LO signal to create an IF signal which can then be subsequently processed by a digital signal processor (DSP)—IF processor. An LO signal is provided to the downconverters 752 and 754 from LO signal source 706 through a power divider 756. The RF signal is provided to the downconverters 752 and 754 depending on the connection of switches 758 and 760.

The switch 758 provides an incident RF signal from one of couplers 721–723 to either the downconverter 752, or through a line to switch 760 which can provide the incident signal to downconverter 754. The switch 760 also provides a connection of the coupler 711 to the downconverter 754. Alternatively, the switch 760 can provide a connection to a switch 762 to the downconverter 754. The switch 762 selectively connects to the coupler 713, or to the coupler 712.

With the three test ports 701–703, the LO 706, two signal sources 708 and 710, and components for connection as shown in FIG. 7 and described above, full three port error corrected measurements can be made for a three port device.

II. Frequency Translation Mixer and Second and Third Order Intercept Measurement The switches 726 and 730 can be set so that the signal sources 708 and 710 can be applied to two ports of the VNA concurrently. The switches of the VNA are all controlled by a processor 764. The processor is then controlled through a user keypad, or through an external computer connection to the VNA. In accordance with the present invention, the processor 764 can controls the DSP-IF processor, so a user can access the processor to set the DSP-IF processor so that it can take measurements in a nonratioed or a ratioed mode. With both signal sources applied concurrently, and the DSP-IF processor acting in a nonratioed mode, the VNA can serve to provide two signal sources and to receive a third signal and process the signal similar to a spectrum analyzer.

Figure 4:
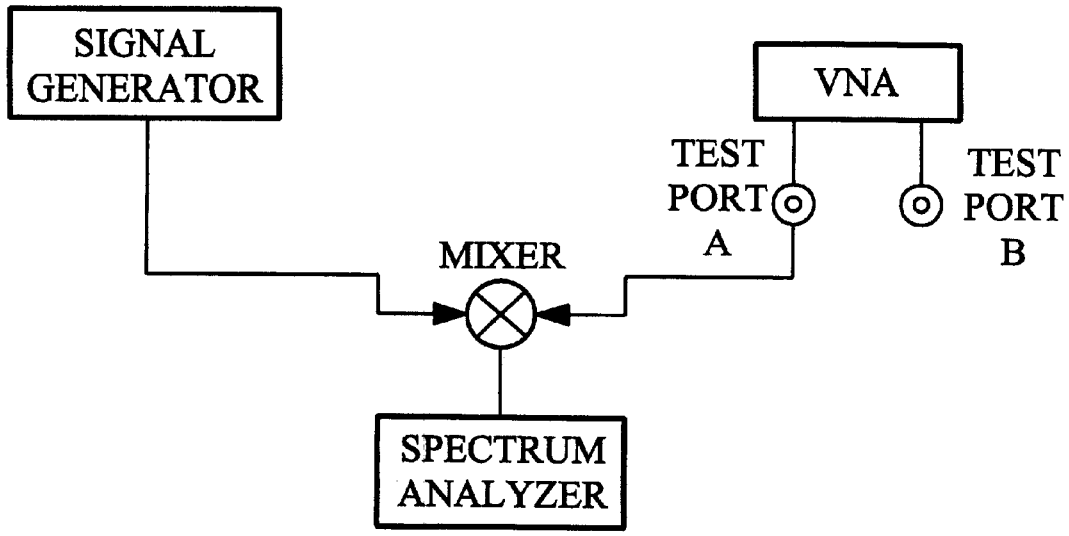
FIG. 4 shows a conventional test set up for measuring the frequency translation ability of a mixer.
Figure 5:
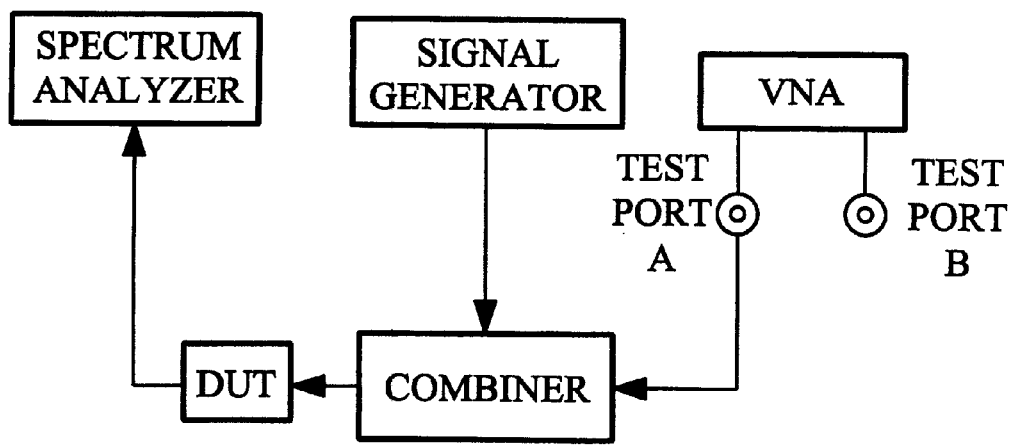
FIG. 5 shows a conventional test set up for measuring second and third order intercept.
Figure 6:
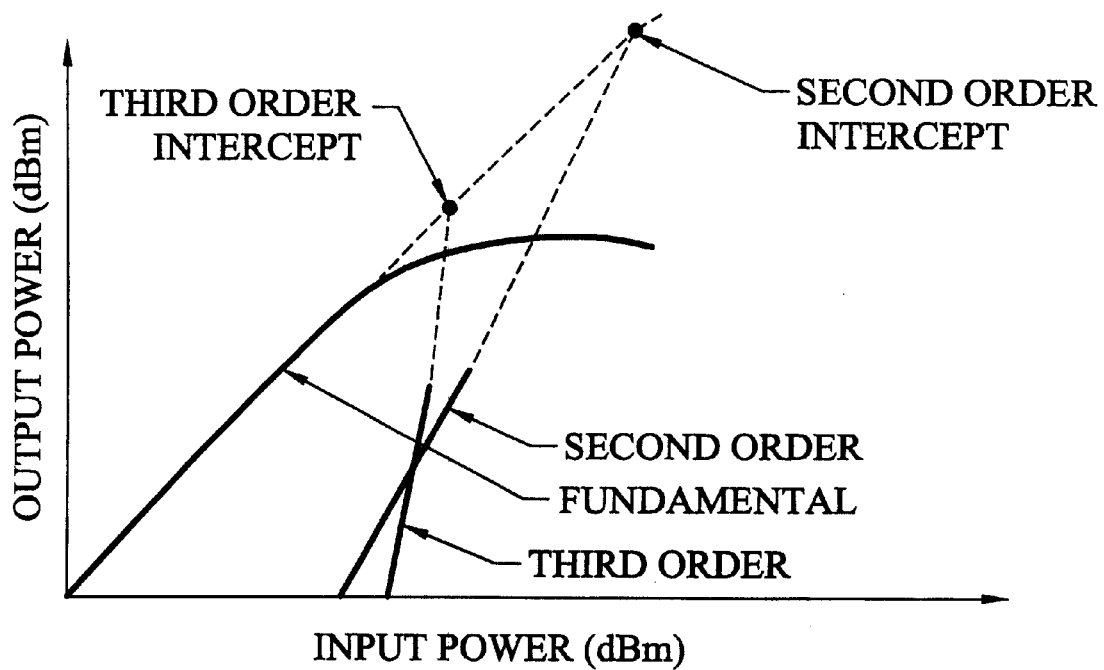
FIG. 6 shows a plot illustrating how second and third order intercept points are derived.

The VNA can, thus, be used in a test set up for measuring the frequency translation response of a mixer with the test setup shown similar to that shown in FIG. 4, but without any of the additional test equipment. With only a coupler, the VNA can further be configured to measure intermodulation distortion (IMD). In particular, IMD can be measured to determine second, third, or higher order intercepts using the test configuration similar to that shown in FIG. 5, but without requiring the additional signal source or spectrum analyzer.

III. Frequency Translation Group Delay Measurement

With the two signal sources, internal modulation synthesizer, special IF circuits and appropriate software, frequency translation group delay measurements can be made using the VNA. With distortion requirements becoming tighter in communication systems, the specifications on group delay of components also becomes more stringent. Group delay variation, or deviations from phase linearity, can lead to substantially distortion of wideband signals. While the traditional group delay measurement $d\phi/d\omega$, where $\phi$ is phase of an S21 transmission measurement and $\omega$ is angular frequency, is applicable for many measurements it fails for frequency translation devices, such as mixers, since accurate and stable phase information is not typically available in unratioed measurements.

In accordance with the present invention to measure group delay, a main carrier of the first signal source 708 is modulated using the modulation synthesizer to provide the main carrier. The outputs from the first signal source 708 and second signal source 710 are then applied through two separate test ports to two inputs of a DUT, such as a mixer. The output of the DUT is then received at a third test port, downconverted using downconverter 754, demodulated using the special IF circuits and its phase is detected relative to the phase of the original signal from the modulation synthesizer. Since the modulating frequency in most DUTs does not change, the measurement can be ratioed against the signal from the modulation synthesizer and phase data extracted.

While in principle any type of modulation can be used, most work has been limited to simple DSB-AM and FM. The FM approach has better immunity to gain compression and other non-linearities and can handle multipliers without frequency distortion. In order to allow for a simple correlation between phase difference and group delay, the modulation is preferably narrow band with a modulation index $\beta<0.3$. When these conditions hold, the group delay relative to a calibration is given by where the phase measurement is actually a phase difference measurement due to the presence of two out-of-phase sidebands in the modulated spectrum:

$$\tau_G = ((\phi + k\pi) - (\phi_{cal} + k_{cal}\pi))/\omega_m$$

Where the k coefficients (+1, 0 or −1) are used to correct for high-side versus low-side mixing, and $\omega_m$ is the modulating frequency. The phase flips are required to compensate for a phase inversion in the mixing process when the LO is higher than the RF relative to when the LO is lower than the RF. An additional $+k\pi$ term is required in the first parenthetical when the DUT is a mixer. Since phase range is limited to $2\pi$ radian span, the maximum group delay that can be measured is $1/f_m$.

Figure 8:
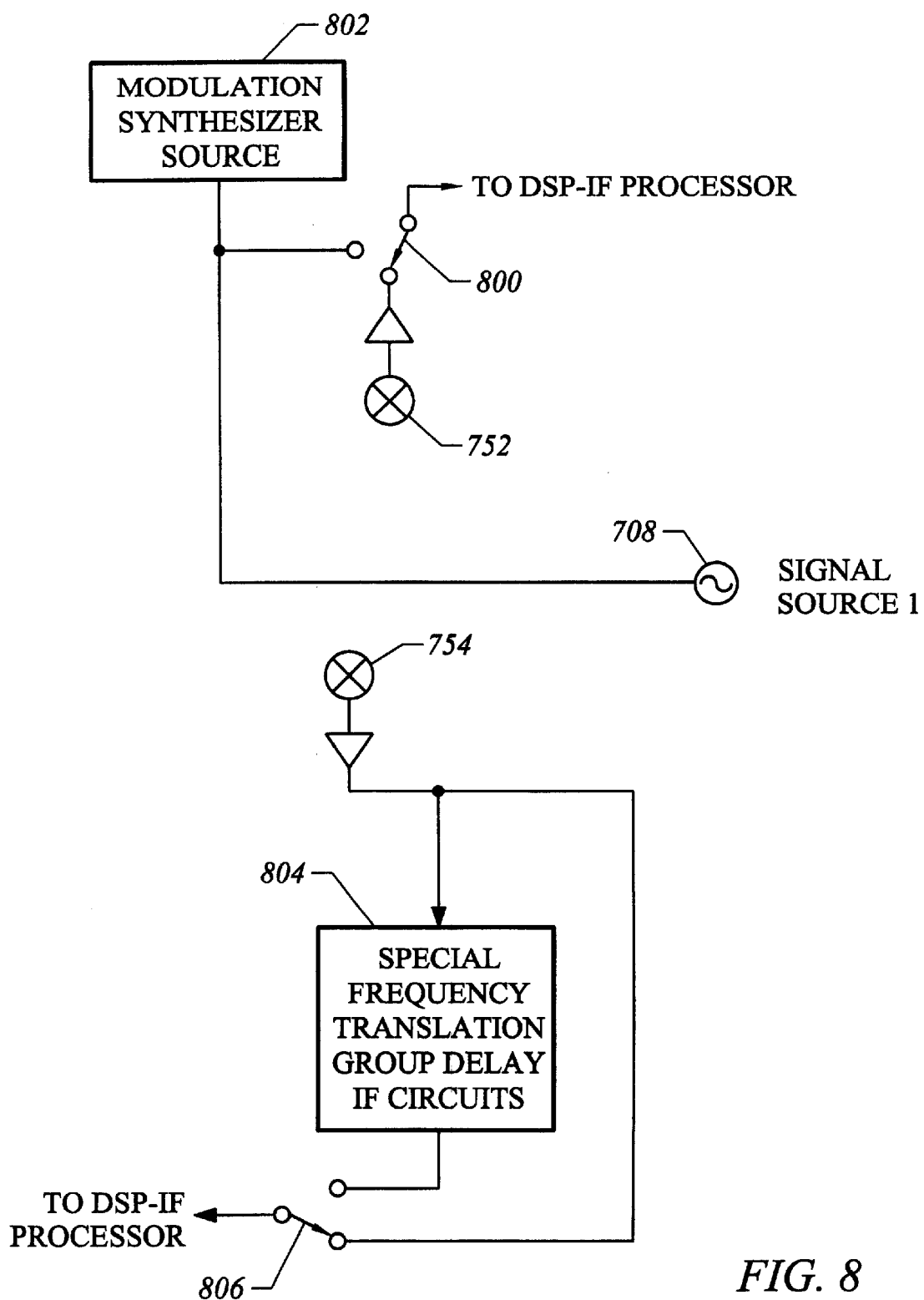
FIG. 8 shows additional components for use with the components of FIG. 7 to provide frequency translation group delay measurements.

FIG. 8 shows components used in conjunction with the components of FIG. 7 to provide frequency translation group delay measurements as described. The circuit utilizes the down converters 752 and 754 and signal source 708 from FIG. 7. The output of the downconverter 752 is provided to an amplifier and filter through a switch 800 to the DSP-IF processor instead of a direct connection as in FIG. 7. The switch 800 also can connect the modulation synthesizer source 802 to the DSP-IF processor when group delay measurements are to be made. The modulation synthesizer source 802 also has an output provided to the signal source 708 to modulate the output signal from the source 708. The output of downconverter 754 can be provided through its amplifier and filter directly to the DSP-IF processor, as in FIG. 7, using the switch 806, or it can be provided indirectly through the special frequency translation group delay IF circuits 804 for group delay phase measurement when group delay measurement is desired to the DSP-IF processor using a switch 806.

IV. Automatic Calibration

Figure 3:
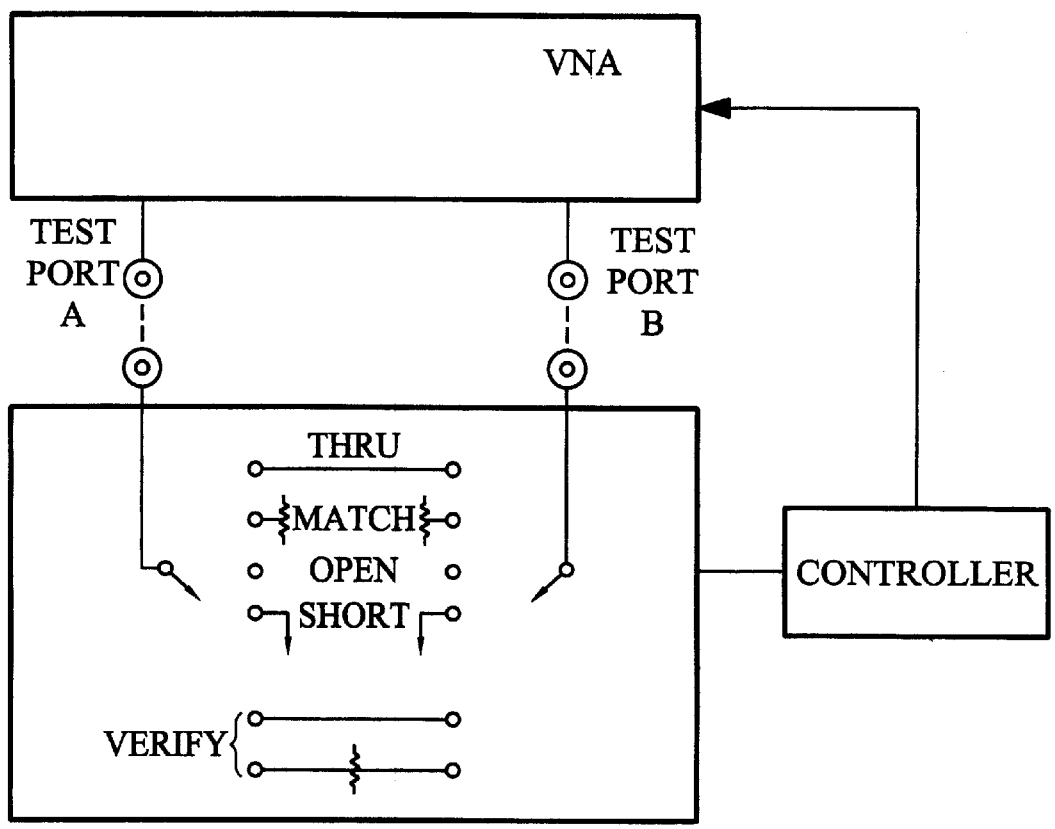
FIG. 3 shows additional components included in a conventional VNA for automatic calibration.

The VNA further includes software for the processor 764, and connections for providing control signals to switches of an automatic calibration device, the automatic calibration device being illustrated in FIG. 3, so that the VNA will function as the controller for the automatic calibration device and the controller, as shown in FIG. 3, can be eliminated. The VNA controls the switches in the calibration device and performs calibration based upon a users operation of a keypad attached to the VNA.

In addition to the calibration components shown in FIG. 3, the automatic calibration device can also include an offset short, or other calibration components which are connectable by the switches shown between its terminals. Preferably calibration components can be provided to allow a variety of calibration types to be selected, such as: short-open-load-through (SOLT), load-reflection-match (LRM), load-reflection-load (LRL), through-reflection-match (TRM), etc.

V. Noise Figure Measurement

Figure 1:
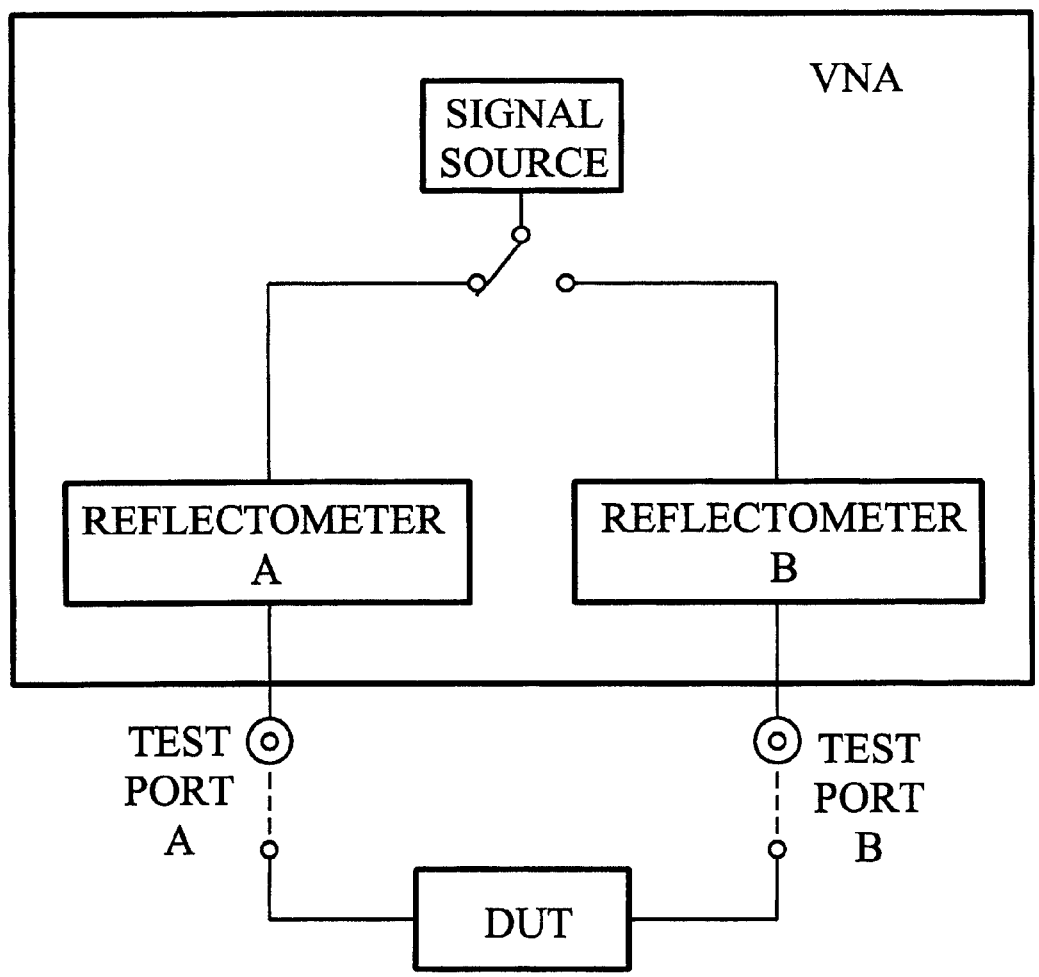
FIG. 1 shows a block diagram of components included in a conventional vector network analyzer (VNA)
Figure 2:
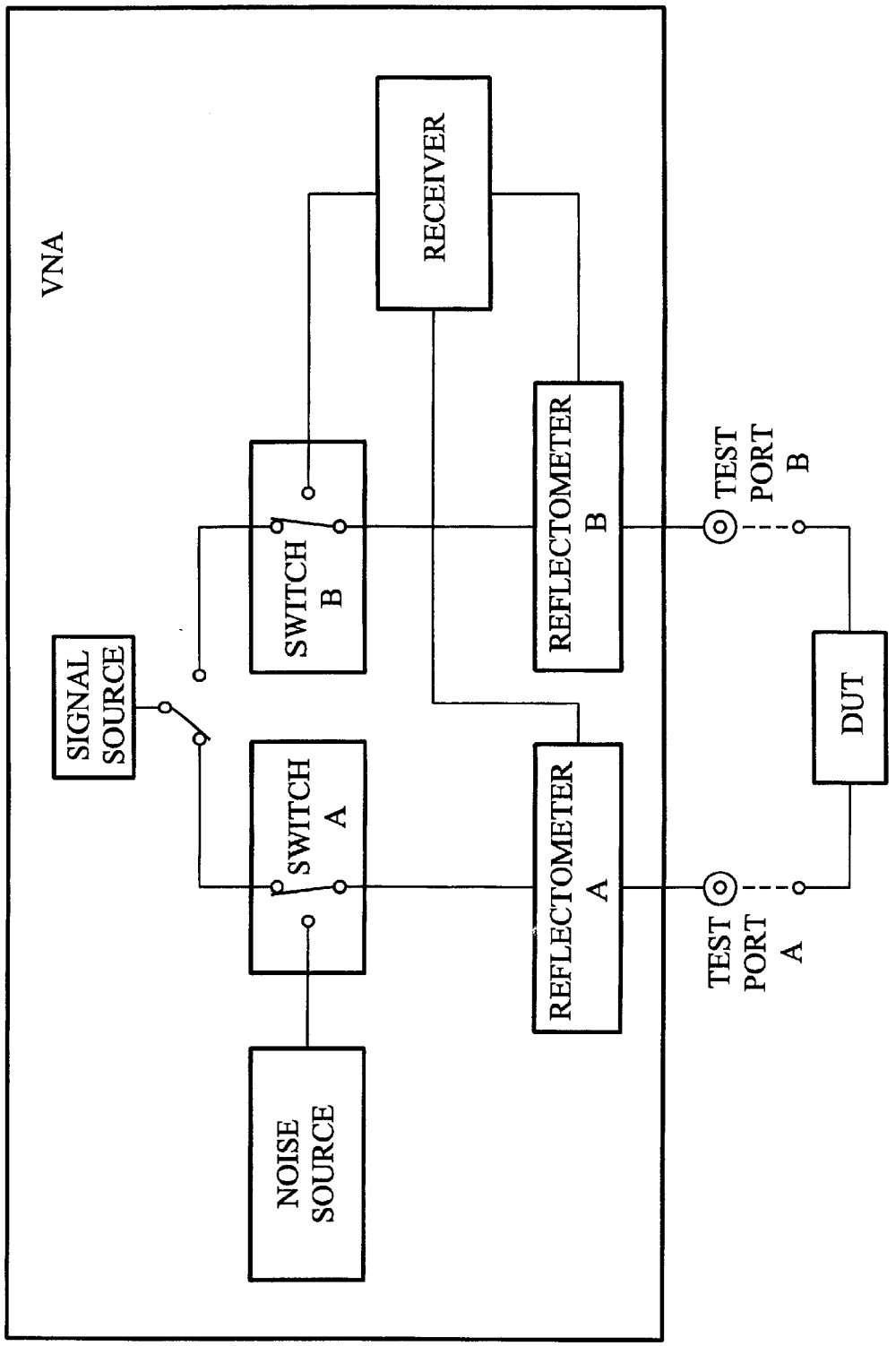
FIG. 2 shows additional components included in a conventional VNA to measure noise figure.

The noise source 714 is externally connectable to a connection port on the backpanel of the VNA. The VNA circuit, in accordance with the present invention, includes further components to make noise figure measurement more flexible. With the noise source 714 connected directly to the backpanel of the VNA, a DUT can be connected between ports 701 and 702 of the VNA. Switch 771, then serves to connect the noise source to port 701. Switch 772 connects port 702 through a low noise amplifier 774 and switch 760 to downconverter 754 which is configured to form part of a receiver similar to the test setup of FIG. 2.

The noise source can alternatively be disconnected and connected directly to one port of a DUT, while the second port of the DUT is connected through port 702 of the VNA and switches 772 and 760 are connected so that the VNA can function as a receiver. With the DUT connected between ports 701 and 702, subsequent measurements can be made of the DUT using the VNA without introducing errors due to reconnection of the device.

The receiver components for noise figure measurement include the downconverter 754 with LO connection from LO source 706 to provide an IF signal, and an amplifier and filter providing the IF signal to a DSP-IF processor. When conventional VNA measurements are made, the DSP-IF processor is configured to make ratioed measurements. When noise figure measurements are made, the DSP-IF processor is controlled by processor 764 to function as a power detector.

Figure 9:
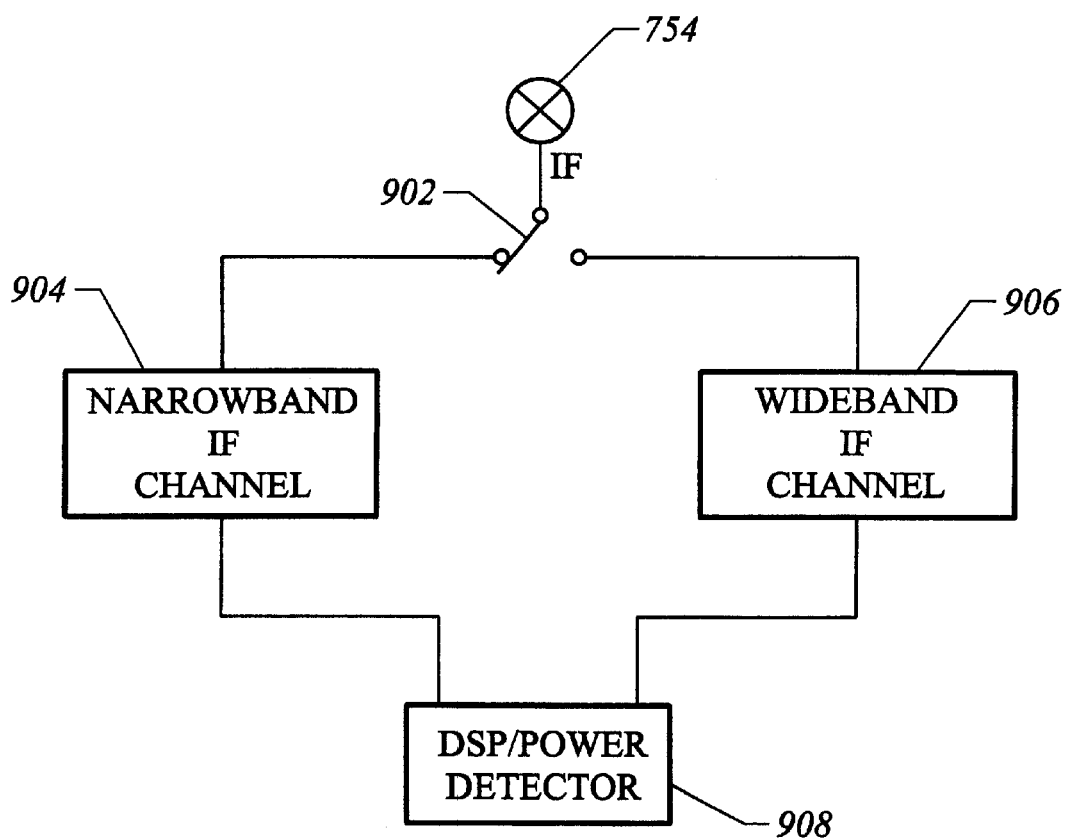
FIG. 9 shows alternative connections from a downconverter to the DSP-IF processor from FIG. 7 to allow flexible noise figure measurements.

An alternative receiver configuration is shown in FIG. 9. The configuration of FIG. 9 includes a switch 902 for connection through either a wideband IF channel 906, or a narrowband IF channel 904 to the DSP-IF processor 908. The wideband IF channel 906 includes a filter and amplifier as in the path described with respect to FIG. 7 for conventional VNA measurements. The narrowband IF channel 904 includes filtering to more limit the frequency range of the IF signal.

The wideband IF channel 906 provides operation over a frequency range typical for receivers used with noise sources for noise figure measurement. The narrowband IF channel 904 includes components operating over a narrower frequency range than the wideband IF path 906 to allow more accurate results, particularly for narrow band DUTs. The narrowband IF path in one embodiment includes components for processing signals over less than a 1 MHZ bandwidth. The switch 902 is controlled by processor 764 to connect the downconverter 754 to either the narrowband IF path 904 or the wideband path 906 depending on whether a user desired narrowband or wideband measurements. In a noise figure measurement mode, the DSP-IF processor 908 is reconfigured from its VNA ratioed scattering parameter measurement mode to function as a power detector. The output of the DSP-IF processor is provided to a display (not shown). The display is further connected to the processor 764 to enable user interaction through a keyboard or computer during measurement processes.

VI. Harmonic Measurement Accuracy Enhancement

The present invention includes a process implemented by the processor 764 and DSP-IF processor to provide for measurements of harmonics from a DUT with calculations to improve measurement accuracy to eliminate the effects of harmonics from one of the signal sources 708 or 710 on the measurements. The harmonic "Hx" of the DUT is established using calculations relative to the source harmonic, the source fundamental, and the output fundamental of the DUT using the process. To begin the process, several general steps are performed using the VNA as outlined in the following paragraphs.

A. Establishing Modes for Calculations

With the source fundamental frequency range covering frequencies from f0 through f1, labeled here as [f0,f1], then the following shorthand can be established for modes used in subsequent calculations:

MODE {N1}: source [f0,f1], receiver [f0,f1]
MODE {N2}: source [2f0,2f1], receiver [2f0,2f1]
MODE {N3}: source [3f0,3f1], receiver [3f0,3f1]
MODE {H2}: source [f0,f1], receiver [2f0,2f1]
MODE {H3}: source [f0,f1], receiver [3f0,3f1]

The numbers 2 and 3 multiplied by the frequency ranges f0–f1 indicate that the second and third harmonics are used respectively. The measurements and calculations described below utilize the second and third harmonics, but other source harmonic levels may be used as long as the measurement ratios determined according to the present invention are not excessively noisy.

To assure measurement accuracy in determining source harmonics, the source power level should be constant during measurements using the above modes. Because the source harmonics are a function of power level at least to some degree, changes in the source power can make calculations inaccurate. If the source is to be operated at different power levels, the corrections determined below must be repeated for each desired power level since source harmonics may vary between different power levels.

B. Connection of Through Line to Establish Normalizations and Relative Source Harmonic Levels In an embodiment in which the DUT to be measured is a two-port device, a through line is connected across two measurement test port terminals of the VNA to establish a plurality of normalization factors and a relative source harmonic level before the DUT is connected to the VNA for subsequent measurements.

To establish the normalization factors, S21 measurements are first acquired from the through line with the system in modes N1, N2, N3, H2 and H3. The S21 values are stored as NS21N1, NS21N2, NS21N3, NS21H2 and NS21H3 respectively. These values will be used to normalize later DUT measurements. Note that the S21 measurements could be trivially replaced by S12 measurements if that is the requested parameter. For one-port S11 or S22 measurements, appropriate normalization is provided with a short.

The received signal, also referred to as the b2 signal, is measured in modes N1, H2 and H3. These b2 values are stored as b2(N1), b2(H2) and b2(H3) respectively.

To account for receiver power deviations from a flat level, an additional mode N0 is defined in which voltage measurements $b2(NO_A)$, $b2(NO_B)$ and $b2(NO_C)$ are made to normalize the b2(N1), b2(H2) and b2(H3) values. The N0 mode is established with the source and receiver operating over the same frequency range, such as f0–f1, as the mode being normalized, but with the source power level set at approximately 0 dBm. Note that it is possible that b2(N0) could be measured and stored as a global vector in the VNA at factory calibration time, since it is not likely to change over time on a scale that would cause errors in unratioed measurements.

Relative source harmonic levels Ox for the second and third harmonics are computed from the b2 values b2(N1), b2(H2) and b2(H3) as follows:

$$O2 = b2(H2)/b2(N1)$$

$$O3 = b2(H3)/b2(N1)$$

The relative source harmonic levels O2 and O3 are scalar quantities without phase information.

C. Connection of DUT and Measurement in Normal Mode

After the normalization factors and the relative source harmonic levels are established, the through line is disconnected and the DUT is connected across the test port terminals of the VNA. Once the DUT is connected, S21 measurements are made in the normal modes N1, N2 and N3. The normalization values NS21N1, NS21N2 and NS21N3 are then applied respectively to obtain transfer coefficients GN1, GN2 and GN3. The GNx vector quantities GN1, GN2 and GN3 are the linear gains that the source fundamental, the second source harmonic and the third source harmonic will experience through the DUT, respectively.

In an embodiment in which the DUT is a nonlinear amplifier, it is desirable that the input source harmonic be at a sufficiently low power level such that the amplifier operates either within the linear region or close to the linear region at the harmonic frequency to obtain the transfer coefficients GN2 and GN3. For example, the power level for the source harmonic during the step of obtaining the transfer coefficient GN2 for the second harmonic may be set at approximately −40 dBc relative to the power level of a carrier signal at the fundamental frequency.

D. Measurement of DUT in Harmonic Mode

While the DUT is connected to the VNA, S21 measurements are also made in the harmonic modes H2 and H3. The normalization values NS21H2 and NS21H3 are then applied respectively to obtain transfer coefficients GH2 and GH3. The GHx values GH2 and GH3 are the DUT output harmonics relative to the source fundamental.

E. Computation of Corrections

With the measurements described above, the DUT output harmonic levels relative to the source harmonic component, the source fundamental frequency component, and the DUT output fundamental frequency component are calculated as follows:

i: Output Harmonic Hx Relative to Source Harmonic Component $$H2 = GH2 - GN2$$

$$H3 = GH3 - GN3$$

ii: Output Harmonic Hx' Relative to Source Fundamental Frequency Component $$|H2'| = |GH2 - GN2|O2$$

$$|H3'| = |GH3 - GN3|O3$$

The computed values |H2'| and |H3'| are scalar quantities since phase information was not available for the Ox values O2 and O3. Alternatively, with only the magnitude of Ox available, the values Hx' could be calculated as vector quantities with the phase of Hx used for the phase of Hx'.

iii: Output Harmonic Hx" Relative to Output Fundamental Frequency Component $$|H2''| = |GH2 - GN2|O2/|GN1|$$

$$|H3''| = |GH3 - GN3|O3/|GN1|$$

Again the computed values |H2"| and |H3"| are scalar quantities, but the values Hx" can be calculated as vector quantities with the phase of Hx/GNx used for the phase of Hx".

F. Establishing Phase

Establishing the phase of harmonic components is particularly relevant for measurements of matching networks for power amplifier design. There is no direct method of establishing phase of the source fundamental relative to its harmonic. However, phase measurements can be made using a phase standard.

One phase standard which may be used in accordance with the present invention is a conventional shunt diode with sufficient RF power applied to it so that the diode starts clipping one side of the waveform. Based on a Fourier analysis, the second and third harmonic components from the DUT must be 180° out of phase relative to the source fundamental. The Fourier analysis is performed with a top-clipped cosine waveform with the reference phase being 0° for the source fundamental frequency component, which has a period T. The Fourier expansion is performed on a period centered at the origin and the clipping time is from −x to +x. Because this waveform represents an even function, only the cosine terms are present in the Fourier expansion.

The Fourier coefficients are thus expressed as:

$$a_n = \frac{4}{T}\int_0^x \cos\left(\frac{2\pi x}{T}\right)\cos\left(\frac{2\pi nt}{T}\right)dt + \frac{4}{T}\int_x^{T/2}\cos\left(\frac{2\pi t}{T}\right)\cos\left(\frac{2\pi nt}{T}\right)dt =$$

$$\frac{2\cos\left(\frac{2\pi x}{T}\right)}{n\pi}\sin\left(\frac{2n\pi x}{T}\right) +$$

$$\frac{1}{\pi}\left[\frac{-1}{n+1}\sin\left(\frac{2(n+1)\pi x}{T}\right) + \frac{-1}{n-1}\sin\left(\frac{2(n-1)\pi x}{T}\right)\right],$$

For the first harmonic or fundamental, $$a_1 = \frac{2\cos\left(\frac{2\pi x}{T}\right)}{n}\sin\left(\frac{2\pi x}{T}\right) + \frac{1}{\pi}\left[\frac{1}{2}\left(-\sin\left(\frac{4\pi x}{T}\right)\right)\right] + 1 - \frac{2x}{T}$$

Since 0<x<T/4, this term will be positive, and the phase reference for the fundamental is 0°.

For the second harmonic, $$a_2 = \frac{\cos\left(\frac{2\pi x}{T}\right)}{\pi}\sin\left(\frac{4\pi x}{T}\right) + \frac{1}{\pi}\left[\frac{-1}{3}\sin\left(\frac{6\pi x}{T}\right) + \frac{-1}{1}\sin\left(\frac{2\pi x}{T}\right)\right]$$

Since 0<x<T/4, it is easy to show that $a_2 \leq 0$ and decreasing, and the phase shift is 180°.

For the third harmonic, $$a_3 = \frac{2\cos\left(\frac{2\pi x}{T}\right)}{3\pi}\sin\left(\frac{6\pi x}{T}\right) + \frac{1}{\pi}\left[\frac{-1}{4}\sin\left(\frac{8\pi x}{T}\right) + \frac{-1}{2}\sin\left(\frac{4\pi x}{T}\right)\right]$$

Since 0<x<T/4, it is easy to show that $a_3 \leq 0$, and the phase shift is 180°.

For the fourth harmonic, $$a_4 = \frac{\cos\left(\frac{2\pi x}{T}\right)}{2\pi}\sin\left(\frac{8\pi x}{T}\right) + \frac{1}{\pi}\left[\frac{-1}{5}\sin\left(\frac{10\pi x}{T}\right) + \frac{-1}{3}\sin\left(\frac{6\pi x}{T}\right)\right]$$

If 0<x/T≤0.17, then $a_4 \leq 0$ and the phase shift is 180°. If x/T≥0.17 indicating more severe clipping of the cosine waveform, $a_4 > 0$ and the phase shift is 0°. Therefore, the phase shift for the fourth harmonic relative to the phase of the fundamental frequency component depends upon the severity of clipping produced by the nonlinear DUT.

Measurements of Hx will acquire the phase angles Φx needed for calculating the phase components of Hx' and Hx". The phase angles measured for Hx are preferably referenced to a 0° reference plane established at the fundamental. With the standard being the shunt diode described above and the fundamental referenced to 0° at the standard, the correction angles 180°−Φ2 and 180°−Φ3 for the second and third harmonics can be applied to obtain the phases of the vector quantities Hx' and Hx". The use of an absolute phase reference plane eliminates the effect of any extra line length at the output of the DUT. The extra line length at the output of the DUT produces unreferenced output phases because of the different phase shifts experienced through the extra line length by the different harmonic signals.

To determine the harmonic phases in accordance with the present invention, a calibration standard, such as the shunt diode described above, is connected to the VNA. With the standard connected, S21 measurements are made in modes H2 and H3. The normalization vector values NS21H2 and NS21H3 are then applied to the H2 and H3 measurements respectively to obtain corrected transfer coefficients termed GH2C and GH3C. S21 measurements are further made with the standard connected in mode {N1} to obtain the transfer coefficient GN1. Next phase offsets POx are calculated as follows:

$$\angle PO2 = \angle \text{ref2} - \angle GH2C + \angle GN1$$

$$\angle PO3 = \angle \text{ref3} - \angle GH3C + \angle GN1$$

wherein $\angle PO2$ and $\angle PO3$ are the harmonic phase responses of the DUT at the second and third harmonics respectively, $\angle \text{ref2}$ and $\angle \text{ref3}$ are 180° as calculated using Fourier series analysis for the shunt diode, $\angle GH2C$ and $\angle GH3C$ are the phases of the corrected harmonic transfer coefficients GH2C and GH3C after normalization, and $\angle GN1$ is the phase of the transfer coefficient GN1 at the fundamental frequency.

After the harmonic phase responses $\angle PO2$ and $\angle PO3$ are obtained, the vector harmonic responses H2' and H3' of the DUT at the second and third harmonics to the input fundamental frequency component are obtained respectively according to the following relationships:

$$H2' = (GH2 - GN2)(1\angle PO2)O2$$

$$H3' = (GH3 - GN3)(1\angle PO3)O3$$

In a similar manner, the vector harmonic outputs H2" and H3" of the DUT at the second and third harmonics relative to the output fundamental frequency component are obtained respectively according to the following relationships:

$$H2'' = (GH2 - GN2)(1\angle PO2)O2/GN1$$

$$H3'' = (GH3 - GN3)(1\angle PO3)O3/GN1$$

The harmonic responses of the DUT to the input fundamental frequency component as well as the harmonic outputs of the DUT relative to the output fundamental frequency component are thus obtained as vector quantities with magnitude and phase information.

VII. Multiple Source/LO Module

Figure 10:
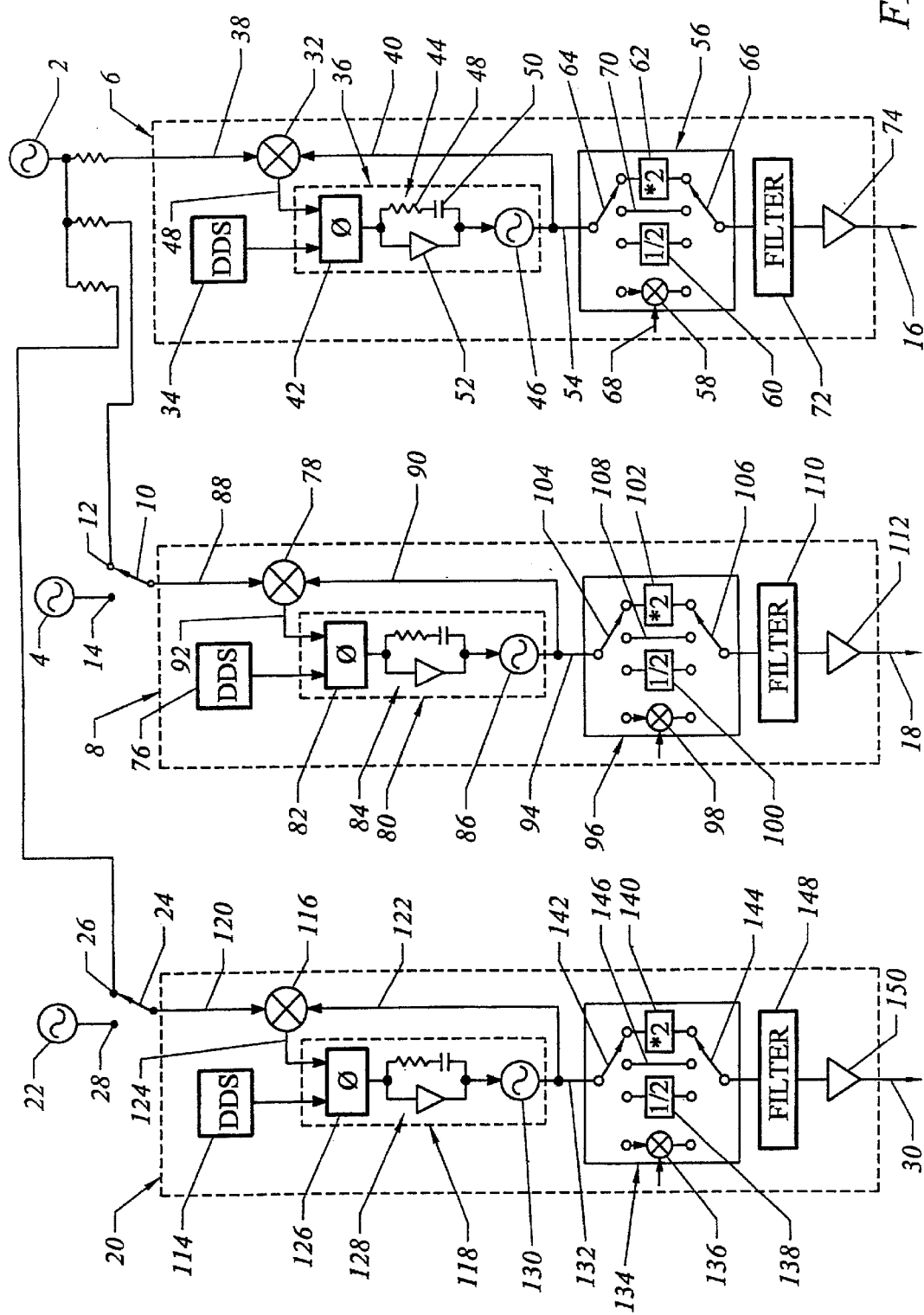
FIG. 10 shows circuitry for a dual source/LO module to provide the signal sources and LO for the circuit of FIG. 7.

FIG. 10 shows circuitry for a dual source/LO module which may be used to provide the RF signal sources 708 and 710 and the LO source 706 for the circuit of FIG. 7. The dual source/LO module is operative in either an independent offset mode, or a common offset mode as described in more detail to follow. As illustrated in FIG. 10, the circuit for the dual-mode multiple signal source/local oscillator module roughly includes a first coarse frequency source 2, a second coarse frequency source 4, a first signal generator 6 coupled to the first coarse frequency source 2, a second signal generator 8, and an offset switch 10 coupled to the second signal generator 8. The offset switch 10 is capable of connecting the second signal generator 8 either to the first coarse frequency source 2 in a first closed position 12 when the module operates in a common offset mode, or to the second coarse frequency source 4 in a second closed position 14 when the module operates in an independent offset mode.

The first signal generator 6 may be implemented as the local oscillator 706 of FIG. 7, having an output 16 which provides a local oscillator (LO) signal. Depending upon the application, the local oscillator signal generated at the output 16 of the first signal generator 6 may provide a signal that mixes against other output signal sources (S1 and S2) to generate the receiver IF. The second signal generator 8 may be implemented in the VNA as a first one of the RF sources 708 or 710 of FIG. 7 having an output 18 which carries a first stimulus source (S1) signal, that may be presented to the DUT. When the offset switch 10 connects the second signal generator 8 to the first coarse frequency source 2, the first and second signal generators 6 and 8 share a common coarse frequency source 2 and are thus said to be in a common offset mode.

On the other hand, when the offset switch 10 connects the second signal generator 8 to the second coarse frequency source 4, the first source (S1) signal generated at the output 18 of the second signal generator 8 and the local oscillator (LO) signal generated at the output 16 of the first signal generator 6 are independently produced by different coarse frequency sources. The first and second signal generators 6 and 8 are thus said to be in an independent offset mode when the offset switch 10 is in the second closed position 14 to connect the second signal generator 8 to the second coarse frequency source 4.

In a further embodiment, additional signal generators similar to the first and second signal generators 6 and 8 may be provided in the dual-mode multiple signal source/local oscillator module according to the present invention when additional signal sources are desired in some VNA applications. FIG. 10 further illustrates an optional third signal generator 20 which may be used as a second of the RF sources 708 and 710 in FIG. 7, a third coarse frequency source 22 and an additional offset switch 24. The additional offset switch 24, which is coupled to the third signal generator 20, is capable of connecting the third signal generator 20 to the first coarse frequency source 2 in the first closed position 26 to set the third signal generator 20 in a common offset mode with respect to the first signal generator 6. Alternatively, the offset switch 24 can be switched to a second closed position 28 to connect the third signal generator 20 to the third coarse frequency source 22 when the third signal generator 20 is desired to be in an independent offset mode with respect to the first signal generator 6.

The third signal generator 20 has an output 30 which carries a second stimulus source (S2) signal that may be presented to the DUT. Depending upon different types of applications, the second and third signal generators 8 and 20 may be both in a common offset mode or both in an independent offset mode with respect to the first signal generator 6. In some other applications, one of the signal generators 8 and 20 may be in an independent offset mode while the other is in a common offset mode with respect to the first signal generator 6. When both the second and third signal generators 8 and 20 are in a common offset mode, all of the signal generators 6, 8 and 20 share a common coarse frequency source 2. Furthermore, the first, second and third signal generators 6, 8 and 20 may have a substantially identical circuit structure in an embodiment.

In a further embodiment, each of the first, second and third signal generators 6, 8 and 20 comprise a fine frequency source, a PLL, a set of optional frequency changers, an output filter and an output amplifier. Referring to FIG. 10, the first signal generator 6 comprises a first mixer 32, a first fine frequency source 34, and a first phase lock circuit 36. The first fine frequency source may comprise a conventional direct digital synthesizer (DDS), for example, with a frequency range of about 1–10 MHZ and a frequency resolution of 1 Hz or less. On the other hand, the coarse frequency source may comprise a conventional oscillator, for example, with a frequency range of about 800–1600 MHZ and a frequency resolution of 750 KHz.

The first mixer 32 has a first input 38 connected to the first coarse frequency source 2 and a second input 40 connected to the output 54 of the first phase lock circuit 36. In an embodiment, the first phase lock circuit 36 includes a first phase comparator 42, a first loop filter 44 coupled to the first phase comparator 42, and a first voltage controlled oscillator 46 coupled to the first loop filter 44. The first phase comparator 42 has inputs coupled to the first fine frequency source 34 and to the output 48 of the first mixer 32. The phase comparator 42 detects a phase difference between the signals generated by the first fine frequency source 34 and the first mixer 32, and in response generates a pump current indicating whether an upshifting or a downshifting of frequency or phase of the signal at the output 54 is required.

The loop filter 44, which comprises a resistor 48, a capacitor 50 and an amplifier 52 in an embodiment, is an integrator with a desired response to filter out high frequency jitters and noises which may be generated by the phase comparator 42. For example, the loop filter may have a bandwidth of about 30 KHz, with appropriate resistance and capacitance values selected for that bandwidth within the scope of ordinary skill in the art. The loop filter 44 receives the pump current and in response outputs a loop filter voltage to the voltage controlled oscillator 46, which generates a phase locked output signal at a frequency determined by the loop filter voltage. The output 54 of the phase lock circuit 36 is connected to the second input 40 of the first mixer 32 through a feedback path to form a PLL.

In a further embodiment, a first output frequency selector 56 is provided in the first signal generator 6 if the desired frequency generated at the local oscillator (LO) output 16 is different from the frequency generated at the output 54 of the phase lock circuit 36. In yet a further embodiment, the first output frequency selector 56 comprises a set of frequency changers 58, 60 and 62, a first frequency select switch 64, and a second frequency select switch 66. The frequency select switches 64 and 66 each have a plurality of selectably closed positions to connect the output 16 of the first signal generator 6 to the output 54 of the first phase lock circuit 36 through one of the frequency changers selected for increasing or decreasing the frequency of the local oscillator (LO) signal at the output 16.

Examples of the frequency changers as illustrated in FIG. 10 include a mixer 58, a frequency divider 60 and a frequency multiplier 62. If the mixer 58 is implemented to change the frequency of the output local oscillator (LO) signal, an input signal at a stable frequency is provided to one input 68 of the mixer 58, while the frequency select switches 64 and 66 are connected to the mixer 58 to enable the mixer 58 to generate an output signal at a frequency that is the difference between the frequency of the input signal at the input 68 and the frequency produced at the output 54 of the phase lock circuit 36.

In a further embodiment, the first and second frequency select switches 64 and 66 are further capable of forming a direct signal propagating path between the output 54 of the first phase lock circuit 36 and the output 16 of the first signal generator 6 without changing the frequency. A direct signal propagating segment 70 is provided between the frequency select switches 64 and 66, and may comprise a typical coaxial transmission line segment, a waveguide segment, a strip line segment or a microstrip segment, depending upon the frequency range of the PLL output signal.

In a further embodiment, a first output filter 72 is coupled to the output 54 of the first phase lock circuit 36 through the first output frequency selector 56 to provide a clean output with reduced spurious frequency content. In yet a further embodiment, a first amplifier 74 is coupled to the first output filter 72 to generate an amplified local oscillator (LO) signal at the output 16 of the first signal generator 6. In the embodiment shown in FIG. 10, the first output filter 72 is connected to the second frequency select switch 66 in the first output frequency selector 56.

In an alternate embodiment in which the frequency selector 56 is not provided, the first output filter 72 may be connected directly to the output 54 of the phase lock circuit 36.

FIG. 10 also shows a detailed circuit diagram of an embodiment of the second signal generator 8 which has a substantially identical structure as that of the first signal generator 6. As shown in FIG. 10, the second signal generator 8 includes a second fine frequency source 76, a second mixer 78, and a second phase lock circuit 80. In a further embodiment, the second phase lock circuit 80 includes a second phase comparator 82, a second loop filter 84 coupled to the second phase comparator 82, and a second voltage controlled oscillator 86 coupled to the second loop filter 84. The second mixer 78 has a first input 88 coupled to the offset switch 10, a second input 90 coupled to the output 94 of the second phase lock circuit 80, and an output 92 coupled to the second phase comparator 82.

The phase comparator 82, which has inputs coupled to the second fine frequency source 76 and to the output 92 of the second mixer 78, detects a phase difference between the two input signals and in response generates a pump current to indicate whether an upshifting or a downshifting of the frequency or phase of the output signal is required.

The second loop filter 84 is coupled to receive the pump current from the second phase comparator 82 to filter out undesirable high frequency jitters and noises outside its bandwidth. In an embodiment, the second loop filter 84 is an integrator having the same circuit design as that of the first loop filter 44 in the first signal generator 6. Other types of conventional loop filters known to a person skilled in the art may also be used in the phase lock circuit 80 to generate a desired loop filter voltage. The second voltage controlled oscillator 86, which is coupled to the second loop filter 84, generates a phase locked output signal at a frequency which is determined by the loop filter voltage. The output 94 of the voltage controlled oscillator 86 is coupled to the second input 90 of the second mixer 78 through a feedback path to form a PLL.

In a further embodiment, the output 94 of the phase lock circuit 80 is coupled to a second output frequency selector 96 in the second signal generator 8 if the frequency of the signal (S1) at the output 18 of the second signal generator 8 is desired to be selectively changed. Similar to the first frequency selector 56 in the first signal generator 6, the second output frequency selector 96 in the second signal generator 8 comprises a second set of frequency changers including a mixer 98, a frequency divider 100, and a frequency multiplier 102 in an embodiment. Third and fourth frequency select switches 104 and 106 are provided in the second output frequency selector 96 to enable selective connection of the output 94 of the second phase lock circuit 80 to the output 18 of the second signal generator 8 through any one of the frequency changers. Furthermore, a direct signal propagating segment 108 such as a transmission line segment, a waveguide segment, a strip line segment or a microstrip segment is provided to allow the frequency select switches 104 and 106 to convey the signal generated by the phase lock circuit 80 to the output 18 of the second signal generator 8 without frequency conversion.

In the embodiment shown in FIG. 10, the second signal generator 8 further comprises a second output filter 110 coupled to the frequency select switch 106, and a second output amplifier 112 coupled to the second output filter 110. In an alternate embodiment in which the frequency generated at the output 18 of the second signal generator 8 need not be selectively changed with respect to the frequency generated by the phase lock circuit 80, the second output filter 110 may be connected directly to the output 94 of the second voltage controlled oscillator 86 to filter the signal generated by the phase lock circuit 80.

Referring to FIG. 10, when the offset switch 10 connects the input 88 of the second mixer 78 to the first coarse frequency source 2 in the first closed position 12, the first and second mixers 32 and 78 within the respective first and second signal generators 6 and 8 receive the coarse reference frequency from the same coarse frequency source 2. However, the phase comparators 42 and 82 in the first and second signal generators 6 and 8 receive fine reference frequencies from separate fine frequency sources 34 and 76, respectively. The phase lock circuits 36 and 80 thus produce separate output signals at stable phase-locked frequencies in response to the same coarse frequency adjustments but independent fine frequency adjustments. When the first and second signal generators 6 and 8 share the common coarse frequency source 2, the two signal generators 6 and 8 are in a common offset mode.

On the other hand, when the offset switch 10 connects the input 88 of the second mixer 78 to the second coarse frequency source 4 in the second closed position 14, the first and second signal generators 6 and 8 become mutually independent circuits without sharing the coarse frequency sources. The first and second signal generators 6 and 8 are thus in an independent offset mode.

In an application in which the VNA with the multiple signal source/local oscillator module according to the present invention is used to measure the parameters of a typical single-port or multi-port DUT, the local oscillator (LO) output 16 may be connected to the VNA receiver and the first source (S1) output 18 may be connected as stimulus to the DUT. When the signal generators 6 and 8 in the multiple signal source/local oscillator module according to the present invention are in a common offset mode, the first coarse frequency source 2 with a coarse frequency resolution provides a common input signal to the two signal generators 6 and 8.

Because the phase noises at the outputs 16 and 18 of the first and second signal generators 6 and 8 are contributed to a large degree by the coarse frequency source 2, the phase noises at the outputs 16 and 18 are likely to be correlated with each other in the common offset mode. When the signals are used as inputs to the VNA's receiver, for example, the effect of phase noises at the outputs 16 and 18 of the first and second signal generators 6 and 8 on the IF signal are significantly reduced because of the high degree of correlation between the phase noises. The two signal generators 6 and 8 are thus said to have low relative phase noise because of the phase correlation resulting from using a common coarse frequency source 2 in the common offset mode, and will result in an improvement in the accuracy of the measurement.

Furthermore, the phase lock circuits 36 and 80 in the first and second signal generators 6 and 8 share the common coarse frequency source 2 and receive fine frequency adjustments from the respective fine frequency sources 34 and 76 in the common offset mode. Since only the fine frequency adjustments but not the coarse frequency adjustments are independent for the two signal generators 6 and 8, and since the fine frequency adjustments settle more quickly than the coarse frequency adjustments, the settling times for the output signals of the respective phase lock circuits 36 and 80 to arrive at their stable phase-locked frequencies do not vary greatly from each other. The two signal generators 6 and 8 are thus said to have a short relative settling time and will have improved measurements speeds due to the dynamic tracking.

When the module according to the present invention is in the independent offset mode, the VNA is able to measure parameters in an environment in which the two outputs 16 and 18 differ by a large frequency, i.e. when a high IF is required. Parameters which can be measured in the independent offset mode include harmonic responses, intermodulation products and frequency translation mixer characteristics. When the first and second signal generators 6 and 8 are coupled to separate coarse frequency sources 2 and 4, the coarse frequency sources 2 and 4 may be set to oscillate at two widely separated frequencies. For example, the first coarse frequency source 2 may be used to generate a second harmonic frequency while the second coarse frequency source 4 may be used to generate the fundamental frequency.

The device under test is thereby able to receive an input at the fundamental frequency while the receiver may be tuned to the second harmonic frequency. The independent offset mode thus allows harmonic measurements to be performed on the DUT by the VNA. The multiple source/local oscillator module according to the present invention therefore allows various parameters to be measured with different requirements for the signal outputs.

FIG. 10 further shows a third signal generator 20 in an embodiment in which an additional stimulus source signal (S2) is desired to be generated by the dual-mode multiple signal source/local oscillator module according to the present invention. As shown in FIG. 10, the third signal generator 20 has the same circuit structure as that of the second signal generator 8. A third coarse frequency source 22, which in an embodiment comprises a conventional oscillator, is provided to generate a frequency with a coarse resolution for the third signal generator 20 when the third signal generator 20 is in an independent offset mode with respect to the first signal generator 6.

As shown in FIG. 10, the third signal generator 20 includes a third fine frequency source 114, a third mixer 116, and a third phase lock circuit 118. The third mixer 116 has a first input 120 connected to the offset switch 24, a second input 122 connected to the output 132 of the phase lock circuit 118, and an output 124. The third phase lock circuit 118, which has a circuit structure substantially identical to the first and second phase lock circuits 36 and 80 described above, includes a third phase comparator 126, a third loop filter 128, and a third voltage controlled oscillator 130.

The third phase comparator 126 has inputs coupled to the third fine frequency source 114 and to the output 124 of the third mixer 116, and generates a pump current upon detecting a phase difference between the two input signals to indicate whether an upshifting or downshifting of the frequency produced at the output 132 is required. The third loop filter 128, which comprises a typical integrator in an embodiment, filters out high frequency jitters and noises which may be generated by the phase comparator 126, and outputs a loop filter voltage to the third voltage controlled oscillator 130. The voltage controlled oscillator 130 generates an output signal at a phase locked frequency which is determined by the loop filter voltage generated by the loop filter 128. The output 132 of the voltage controlled oscillator 130 is coupled to the second input 122 of the third mixer 116 through a feedback path to form a PLL.

In a further embodiment, the third signal generator 20 further comprises a third output frequency selector 134 which comprises a plurality of frequency changers including, for example, a mixer 136, a frequency divider 138 and a frequency multiplier 140, as illustrated in FIG. 10. A set of frequency select switches 142 and 144 are provided to couple the output 132 of the phase lock circuit 118 to the output 30 of the third signal generator 20 through any one of the frequency changers. The frequency select switches 142 and 144 each have a plurality of selectively closed positions to connect the output 132 of the third phase lock circuit 118 to the output 30 of the third signal generator 20 through the selected frequency changer. Furthermore, a direct signal propagating segment 146, such as a transmission line segment, a waveguide segment, a strip line segment or a microstrip segment, is provided between the frequency select switches 142 and 144 to allow the output 132 of the third phase lock circuit 118 to be coupled to the output 30 of the third signal generator 20 without frequency conversion.

In yet a further embodiment, a third output filter 148 is coupled to the frequency select switch 144, and a third output amplifier 150 is coupled to the third output filter 148 to generate the additional source signal (S2). In an alternate embodiment in which no frequency conversion is required for the additional source signal (S2) output 30, the third output filter 148 may be coupled directly to the output 132 of the third phase lock circuit 118.

As discussed above, the third signal generator 20 is in a common offset mode with respect to the first signal generator 6 when the third offset switch 24 in position 26 connects the first input 120 of the third mixer 116 to the first coarse frequency source 2. On the other hand, when the offset switch 24 is switched to the second position 28 to connect the first input 120 of the third mixer 116 to the third coarse frequency source 22, the third signal generator 20 operates independently from the first signal generator 6 and is thus in an independent offset mode. The second and third signal generators 8 and 20 may both operate in an independent offset mode or both operate in a common offset mode with respect to the first signal generator 6. Alternatively, one of the signal generators 8 and 20 may operate in an independent offset mode while the other operates in a common offset mode with respect to the first signal generator 6.

Furthermore, the output frequencies generated by the second and third signal generators 8 and 20 may be the same as or different from the local oscillator (LO) frequency generated by the first signal generator 6, by selecting different frequency changers within the respective signal generators. The circuit as illustrated in FIG. 10 thus affords flexibility to the VNA to generate local oscillator and source signals (LO, S1, S2) to satisfy a variety of needs in independent and common offset modes.

Although the present invention has been described above with particularity this was merely to teach one of ordinary skill how to make and use the invention. Many changes and modifications will be apparent to those skilled in the art within the scope of the invention as defined by the following claims.

What is claimed is:
1. A vector network analyzer (VNA) comprising:
a first test port;
a second test port;
a third test port;
a first signal source;
a fist switch having a common terminal coupled to the first signal source, a first connection terminal coupled to the first test port and a second connection terminal coupled to the second test port;
a first coupler having a through path coupling the first test port to the first connection terminal of the first switch, and having a coupling path terminal;
a second coupler having a through path coupling the second test port to the second connection terminal of the first switch, and having a coupling path terminal;
a third coupler having a through path coupled one end to the third port, and having a coupling path terminal;
a downconverter; and
a second switch having a common terminal coupled to the downconverter, a first switching terminal coupled to the coupling path terminal of the first coupler, a second switching terminal coupled to the coupling path terminal of the second coupler, and a third switching terminal coupled to the coupling path terminal of the third coupler.

2. A vector network analyzer (VNA) comprising:
a first test port (701);
a second test port (702);
a third test port (703);
a first signal source (708);
a first switch (730) having a common terminal coupled to the first signal source, a first connection terminal coupled to the first test port, and a second connection terminal coupled to the second test port;
a first coupler (712) having a through path coupling the first test port to the first connection terminal of the first switch, and having a coupling path terminal;
a second coupler (711) having a through path coupling the second test port to the second connection terminal of the first switch, and having a coupling path terminal;
a third coupler (713) having a through path coupled one end to the third port, and having a coupling path terminal;
a first downconverter (754);
a second switch (760) having a common terminal coupled to the first downconverter, and switching terminals for selectively coupling to the coupling path terminal of the first coupler, the coupling path terminal of the second coupler, and the coupling path terminal of the third coupler;
a fourth coupler (722) having a through path coupled between the through path of the first coupler and the first connection port of the first switch (730), and having a coupling path terminal;
a fifth coupler (721) having a through path coupled between the through path of the second coupler and the second connection port of the first switch (730), and having a coupling path terminal;
a sixth coupler (723) having a through path coupled to the second end of the through path of the third coupler, and having a coupling path terminal;
a second downconverter (752); and
a third switch (758) having a common terminal coupled to the second downconverter, and switching terminals for selectively coupling to the coupling path terminal of the fourth coupler, the coupling path terminal of the fifth coupler, and the coupling path terminal of the sixth coupler.

3. The VNA of claim 2 further comprising:
a local oscillator (706) coupled to a second input of the first downconverter (754) and to a second input of the second downconverter (752).

4. The VNA of claim 3 further comprising:
a second signal source (710) coupled to the through path of the third coupler (713) and the sixth coupler (723).

5. The VNA of claim 4, wherein the first signal source (708) comprises a synthesizer (6) having an input provided from a first oscillator (2),
wherein the local oscillator (706) comprises a synthesizer (8) having an input connected to a common terminal of a fourth switch (10), the fourth switch (10) having a first switching terminal selectively coupled to the first oscillator (2) and a second oscillator (4) having a more coarse resolution than the first oscillator (2), and
wherein the second signal source (710) comprises a synthesizer (20) having an input connected to a common terminal of a fifth switch (24), the fifth switch (24) having a first switching terminal selectively coupled to the first oscillator (2) and a third oscillator (22).

6. The VNA of claim 3 further comprising:
a noise signal source;
a fourth switch having a common terminal connected to the through port of the second coupler and a switching port for selectively coupling to the noise signal source and to the through path of the fifth coupler; and
a fifth switch having a common terminal connected to the through port of the first coupler and a switching port for selectively coupling to the through path of the fourth coupler and to the switching terminal of the second switch.

7. The VNA of claim 3,
wherein the first signal source (708) comprises a synthesizer (6) having an input provided from a first oscillator (2), and
wherein the local oscillator (706) comprises a synthesizer (8) having an input connected to a common terminal of a fourth switch (10), the fourth switch (10) having a first switching terminal selectively coupled to the first oscillator (2) and a second oscillator (4) having a more coarse resolution than the first oscillator (2).

8. The VNA of claim 2 further comprising:
a fourth switch (904) having a common terminal coupled to the output of the first downconverter (754), and having first and second switching terminals;
a power detector (908);
a narrowband IF channel having an input connected to the first switching terminal, and having an output (904) connected to the power detector; and
a wideband IF channel having an input connected to the second switching terminal, and having an output (906) connected to the power detector.

9. The VNA of claim 2 further comprising:
a fourth switch (800) having a common terminal for connecting to a digital IF processor, and having first and second switching terminals;
a series amplifier and filter connecting an output of the first downconverter (752) to the first terminal of the fourth switch (800); and
a modulation synthesizer (802) source having an output coupled to the second switching terminal of the fourth switch (800), and the output of the modulation synthesizer (802) further being connected to an input of the first signal source (708).

10. The VNA of claim 9 further comprising:
a fourth switch (806) having a common terminal for connecting to a digital IF processor, and having first and second switching terminals;
a frequency translation group delay IF circuit (804) having an input, and having an output connected to the first switching terminal of the fourth switch (806); and
a series amplifier and filter connecting an output of the second downconverter (754) to the input of the frequency translation group delay IF circuit, and the output of the series amplifier and filter further being connected to the second switching terminal of the fourth switch (806).

11. A method of measuring characteristics of a test device using a vector network analyzer (VNA), the method comprising the steps of:
applying a first source signal through a first test port of the VNA, the first test port being connected to the test device;
measuring the signal strength of the first source signal; and
measuring a return signal from at least one of the first test port, a second test port, and a third test port resulting from the first source signal, the second test port and the third test port further being connected to the test device.

12. The method of claim 11, further comprising the step of:
applying a second source signal through the second test port, wherein in the step of measuring a return signal from at least one of the first test port, the second test port, and the third test port results from both the first signal source and the second signal source.

13. The method of claim 11, further comprising the steps of:
disconnecting the first signal source;
connecting a noise signal source;
applying a noise signal source through the first test port of the analyzer;
measuring a return signal from the second test port resulting from the noise signal source.

* * * * *